(12) United States Patent
Kishino et al.

(10) Patent No.: US 8,050,305 B2
(45) Date of Patent: Nov. 1, 2011

(54) SEMICONDUCTOR DEVICE

(75) Inventors: Katsumi Kishino, Tokyo (JP); Ichiro Nomura, Tokyo (JP); Koshi Tamamura, Tokyo (JP); Kunihiko Tasai, Kanagawa (JP); Tsunenori Asatsuma, Kanagawa (JP); Hitoshi Nakamura, Tokyo (JP); Sumiko Fujisaki, Tokyo (JP); Takeshi Kikawa, Tokyo (JP)

(73) Assignees: Sony Corporation, Tokyo (JP); Hitachi, Ltd., Tokyo (JP); Sophia School Corporation, Tokyo (JP)

( * ) Notice: Subject to any disclaimer, the term of this patent is extended or adjusted under 35 U.S.C. 154(b) by 310 days.

(21) Appl. No.: 12/132,063

(22) Filed: Jun. 3, 2008

(65) Prior Publication Data

US 2008/0298415 A1 Dec. 4, 2008

(30) Foreign Application Priority Data

Jun. 4, 2007 (JP) ................ P2007-147577

(51) Int. Cl.
*H01S 5/347* (2006.01)
*H01S 5/327* (2006.01)
*H01L 31/0272* (2006.01)
*H01L 31/0296* (2006.01)

(52) U.S. Cl. ..................... 372/45.012; 257/22

(58) Field of Classification Search ............. 372/45.012; 257/22; *H01S 5/347, 5/327; H01L 31/0272, H01L 31/0296*
See application file for complete search history.

(56) References Cited

U.S. PATENT DOCUMENTS 6,399,473 B1 * 6/2002 Fischer et al. ................ 438/602

OTHER PUBLICATIONS

Che et al., "Visible Light Emitting Diode with ZnCdSe/BeZnTe Superlattices as an Active Layer and MgSe/BeZnTe Superlattices as a p-Cladding Layer", 2002, Phys. Stat. Sol. (b), 229, No. 2, 1001-1004.*

* cited by examiner

*Primary Examiner* — Jessica Stultz
*Assistant Examiner* — Joshua King
(74) *Attorney, Agent, or Firm* — SNR Denton US LLP

(57) ABSTRACT

A semiconductor device having high reliability, a long lifetime and superior light emitting characteristics by applying a novel material to a p-type cladding layer is provided. A semiconductor device includes a p-type semiconductor layer on an InP substrate, in which the p-type semiconductor layer has a laminate structure formed by alternately laminating a first semiconductor layer mainly including $Be_{x1}Mg_{x2}Zn_{x3}Te$ ($0<x1<1$, $0 \leq x2<1$, $0<x3<1$, $x1+x2+x3=1$) and a second semiconductor layer mainly including $Be_{x4}Mg_{x5}Zn_{x6}Te$ ($0<x4<1$, $0<x5<1$, $0 \leq x6<1$, $x4+x5+x6=1$).

17 Claims, 4 Drawing Sheets

SEMICONDUCTOR DEVICE

CROSS REFERENCES TO RELATED APPLICATIONS

The present invention contains subject matter related to Japanese Patent Application JP 2007-147577 filed in the Japanese Patent Office on Jun. 4, 2007, the entire contents of which being incorporated herein by reference.

BACKGROUND OF THE INVENTION

1. Field of the Invention

The present invention relates to a semiconductor device including a p-type semiconductor layer on an InP substrate.

2. Description of the Related Art

Applications of laser diodes (LDs) include not only light sources for optical disk devices such as CD (Compact Disk) systems, DVD (Digital Versatile Disk) systems and blue-ray disc (BD) systems but also various fields such as optical communications, solid-state laser excitation, material processing, sensors, measuring instruments, medical use, printers and displays. Moreover, light emitting diodes (LEDs) are applied to fields such as indicator lamps for electrical appliances, infrared communication, printers, displays and lighting fixtures.

However, in the LEDs, the efficiency when emitting green light having the highest human visibility is not so high, compared to when emitting light of other colors, and LDs have not yet obtained a practicable characteristic in a visible light range from pure blue (slightly higher than 380 nm) to orange (slightly higher than 600 nm). For example, E. Kato et al. have reported that in a blue-green LD with a wavelength of around 500 nm which is formed by laminating a Group II-VI compound semiconductor on a GaAs substrate, the room-temperature continuous-wave operation for approximately 400 hours with 1 mW has been achieved (refer to E. Kato et al. "Significant progress in II-VI blue-green laser diode lifetime" Electronics Letters 5 Feb. 1998 Vol. 34 No. 3 p. 282-284); however, the material system does not obtain a characteristic exceeding this. It is considered that the reason is attributed to physical properties of the material such as easy formation and movement of crystal defects.

In Group II-VI compound semiconductors, typically p-type conductivity control is not easy, and in particular, there is a tendency that the larger an energy gap is, the smaller the p-type carrier concentration becomes. For example, in ZnMgSSe used as a p-type cladding layer in E. Kato et al. "Significant progress in II-VI blue-green laser diode lifetime" Electronics Letters 5 Feb. 1998 Vol. 34 No. 3 p. 282-284, the larger the Mg composition ratio is, the larger the energy gap becomes. However, when the energy gap is approximately 3 eV or over, the p-type carrier concentration becomes smaller than $1 \times 10^{17}$ cm$^{-3}$, thereby it is not easy to use ZnMgSSe as the p-type cladding layer. It is considered that it is because nitrogen (N) as a p-type dopant in the form of atom is included in ZnMgSSe, but most of nitrogen atoms exist in an interstitial site except for a Group VI site, so the nitrogen atoms are not carriers, that is, it is because the activation ratio of the p-type dopant is low (much lower than 1%). Further, it is considered that the existence of a large number of atoms in an interstitial site in such a manner is a major reason for the formation of crystal defects.

Moreover, in E. Kato et al. "Significant progress in II-VI blue-green laser diode lifetime" Electronics Letters 5 Feb. 1998 Vol. 34 No. 3 p. 282-284, ZnCdSe used as an active layer is not fully lattice-matched to the GaAs substrate, so ZnCdSe has distortion. Typically, in a light-emitting device or a light-receiving device, crystal defects are propagated and diffused from a region having the largest number of crystal defects by influences such as heat, electrical conduction and distortion to reach the active layer, thereby the crystal defects cause deterioration of the device or reduction in lifetime. Therefore, in the case where the active layer has distortion as in the case of E. Kato et al. "Significant progress in II-VI blue-green laser diode lifetime" Electronics Letters 5 Feb. 1998 Vol. 34 No. 3 p. 282-284, when crystal defects exist in the p-type cladding layer or the like, there is a high possibility that the crystal defects cause deterioration of the device. Therefore, even in the case where the energy gap of the p-type cladding layer is increased, it is necessary to be capable of keeping the activation ratio of the p-type dopant at 1% or over, and to form a light-emitting device in which the active layer does not have distortion.

Therefore, the inventors of the present invention and several research groups inside and outside Japan have focused attention on a $Mg_xZn_yCd_{1-x-y}Se$ Group II-VI compound semiconductor ($0 \leq x \leq 1$, $0 \leq y \leq 1$, $0 \leq 1x-y \leq 1$) as a candidate of a material for forming an optical device emitting light with a wavelength ranging from yellow to green, and have researched and developed the semiconductor (refer to N. Dai et al. "Molecular beam epitaxial growth of high quality Zn1-xCdxSe on InP substrates" Appl. Phys. Lett. 66, 2742 (1995) and T. Morita et al. "Molecular Beam Epitaxial Growth of MgZnCdSe on (100) InP Substrates" J. Electron. Mater. 25, 425 (1996)). $Mg_xZn_yCd_{1-x-y}Se$ (hereinafter simply referred to as "MgZnCdSe") has such a characteristic that in the case where the compositions of x and y satisfy the following relational expressions, MgZnCdSe is lattice-matched to InP, and when the compositions of x and y are changed from (x=0, y=0.47) to (x=0.8, y=0.17), the energy gap is able to be controlled from 2.1 eV to 3.6 eV.

$$y = 0.47 - 0.37x$$

The composition x ranges from 0 to 0.8 both inclusive.
The composition y ranges from 0.17 to 0.47 both inclusive.

Moreover, throughout the above-described composition ranges, the band gap is of a direct transition type, and the energy gap corresponds to a wavelength of 590 nm (orange) to 344 nm (ultraviolet). This suggests that an active layer and a cladding layer constituting a light-emitting device emitting light with a wavelength from yellow to green may be achieved only by changing the compositions x and y in MgZnCdSe.

Actually, it is reported in T. Morita et al. that in the photoluminescence measurement of MgZnCdSe grown on an InP substrate performed by a molecular beam epitaxy (MBE) method, MgZnCdSe Group II-VI compound semiconductors having different composition ratios x and y obtain such a good light emitting characteristic that the peak wavelength ranges from 571 nm to 397 nm (refer to T. Morita et al. "Molecular Beam Epitaxial Growth of MgZnCdSe on (100) InP Substrates" J. Electron. Mater. 25, 425 (1996)).

Moreover, it is reported by L. Zeng et al. that an LD formed of MgZnCdSe achieves laser oscillation by light excitation in each of wavelength bands of red, green and blue (refer to L. Zeng et al. "Red-green-blue photopumped lasing from ZnCdMgSe/ZnCdSe quantum well laser structure grown on InP" Appl. Phys. Lett. 72, 3136 (1998)).

On the other hand, laser oscillation by the current drive of an LD made of only MgZnCdSe has not been reported yet. It is considered that a major reason is that it is difficult to control p-type conductivity by impurity doping into MgZnCdSe.

Therefore, the inventors of the present invention have been conducted research for finding a suitable material for an active layer, a p-type cladding layer or the like in the case where MgZnCdSe is used as an n-type cladding layer. As a result, as the active layer, $Zn_sCd_{1-s}Se$ (0<s<1) (hereinafter simply referred to as "ZnCdSe") is used, and as the p-type cladding layer, a MgSe/BeZnTe laminate structure formed by alternately laminating a $Be_tZn_{1-t}Te$ layer (0<t<1) (hereinafter simply referred to as "BeZnTe") and a MgSe layer is used, thereby 77 K oscillation of an yellow-green LD with a wavelength of 560 nm is achieved. The 77 K oscillation means that a light-emitting device is oscillated in a state in which the light-emitting device is cooled to 77 K. Moreover, as the active layer, instead of ZnCdSe, $Be_uZn_{1-u}Se_wTe_{1-w}$ (0<u<1, 0<w<1) (hereinafter simply referred to as "BeZnSeTe") is used, thereby single peak light emission from orange to yellow-green at 594 nm, 575 nm and 542 nm is observed, and a 575-nm LED achieves light emission for 5000 hours or over at room temperature.

In this case, BeZnTe used as a part of the p-type cladding layer is lattice-matched to the InP substrate in the case where the Be composition ratio t is approximately 0.5, and the p-type hole concentration at this time is $1 \times 10^{18}$ cm$^{-3}$ or over (in actual, approximately $4.8 \times 10^{18}$ cm$^{-3}$) in the case where N is an acceptor, and a direct transition energy gap at a Γ point at this time is 3.12 eV at room temperature (an indirect transition energy gap is 2.77 eV at room temperature). In addition, BeZnTe has crystal strength unique to a Be chalcogenide material. On the other hand, ZnCdSe used as the active layer is lattice-matched to the InP substrate in the case where the Zn composition ratio s is approximately 0.48, and the energy gap at this time is 2.06 eV at room temperature.

Thus, the energy gap of BeZnTe is larger than that of ZnCdSe, so it is expected from a typical tendency in the past that the refractive index of BeZnTe is smaller than the refractive index of ZnCdSe; however, it is found out by an actual evaluation that the refractive index of BeZnTe is larger than the refractive index of ZnCdSe. In other words, it is found out that it is difficult to confine light within the active layer.

Moreover, when the band structures of ZnCdSe and BeZnTe are examined, it is found out that the top of the valence band of BeZnTe is higher than that of ZnCdSe, and a Type II junction between ZnCdSe and BeZnTe is formed. In other word, it is found out that they are in a state in which hole injection from the p-type cladding layer into the active layer is not sufficiently performed.

Therefore, the inventors of the present invention have focused attention on MgSe which has a distinctly small refractive index among materials relating to Group II-VI compound semiconductors, and has a lattice constant close to that of InP, and the inventors of the present invention have had an attempt to apply a MgSe/BeZnTe superlattice structure formed by alternately laminating BeZnTe and MgSe with a thickness corresponding to several molecular layers to the p-type cladding layer. As a result, it is found out that the refractive index of the p-type cladding layer becomes smaller than the refractive index of a ZnCdSe active layer (refer to I. Nomura et al. "Refractive Index Measurements of BeZnTe and Related Superlattices on InP and Application for Waveguide Analysis of MgZnCdSe/BeZnTe Visible Lasers" phys. stat. sol (b) 229, 987 (2002)). Moreover, a quantum confinement effect shifts a sublevel in the valence band, so the top of the sublevel in the valence band of the superlattice structure is expected to be lower than that of ZnCdSe, that is, it is expected that a Type I junction is formed (refer to broken lines in FIG. 6). FIG. 6 schematically shows an example of the band structure of each layer, and in FIG. 6, reference numerals 112, 113 and 115, 114, 116, 116A, and 116B denote an n-type cladding layer, guide layers, an active layer, a p-type cladding layer, a BeZnTe layer, and a MgSe layer, respectively. Therefore, it is found out that when the above-described MgSe/BeZnTe superlattice structure is applied to the p-type cladding layer, it becomes possible to sufficiently perform hole injection from the p-type cladding layer into the active layer and to confine light within the active layer.

However, it is reported that MgSe has high reactivity, and doping into MgSe is expected to be relatively difficult, and when MgSe has a thickness of approximately 0.2 to 0.4 μm, MgSe is changed from a zinc blend (ZB) structure to a rock salt (RS) structure, and the lattice constant of MgSe is also changed, so a MgSe single layer structure has not been examined in depth (refer to H. M. Wang et al. "Surface reconstruction and crystal structure of MgSe films grown on ZnTe substrates by MBE" J. Crystal Growth 208, 253 (2000)).

SUMMARY OF THE INVENTION

In a MgSe/BeZnTe superlattice structure, Se and Te exist at the same time. In such a condition, Be and Se which have specifically high reactivity may be combined, or a phenomenon that Se is preferentially combined to a Group II element, and it is difficult for Te to enter into the MgSe/BeZnTe superlattice structure (competition reaction) or a phenomenon that Se and Te are separately deposited may occur.

Moreover, when a MgSe layer is doped with N, crystal defects are increased. Moreover, N in a p-type cladding layer and Mg in MgSe are easily combined with each other to form a compound such as $Mg_3N_2$. Further, the MgSe layer easily absorbs water from the air, and has a property that the MgSe layer is easily combined with oxygen in the air to be oxidized.

Therefore, in the case where the MgSe/BeZnTe superlattice structure is applied to a p-type cladding layer, a decline in the reliability of a device, a reduction in the lifetime of the device and deterioration of light emitting characteristics may occur.

In view of the foregoing, it is desirable to provide a semiconductor device with high reliability, a long lifetime and superior light emitting characteristics by applying a novel material to a p-type cladding layer.

According to an embodiment of the invention, there is provided a semiconductor device including a p-type semiconductor layer on an InP substrate, in which the p-type semiconductor layer has a laminate structure formed by alternately laminating a first semiconductor layer mainly including $Be_{x1}Mg_{x2}Zn_{x3}Te$ (0<x1<1, 0≦x2<1, 0<x3<1, x1+x2+x3=1) and a second semiconductor layer mainly including $Be_{x4}Mg_{x5}Zn_{x6}Te$ (0<x4<1, 0<x5<1, 0≦x6<1, x4+x5+x6=1).

In the semiconductor device according to the embodiment of the invention, as the p-type semiconductor layer on the InP substrate, a laminate structure formed by alternately laminating the first semiconductor layer mainly including $Be_{x1}Mg_{x2}Zn_{x3}Te$ and the second semiconductor layer mainly including $Be_{x4}Mg_{x5}Zn_{x6}Te$ is used, so Se and Te do not exist at the same time. Thereby, there is little possibility that Se and Te are combined, or competition reaction or separate deposition of Se and Te occurs. Moreover, MgSe is not used in the p-type semiconductor layer, so crystal defects caused by doping with N may be reduced. Further, the amount of production of a compound such as $Mg_3N_2$ may be reduced, and there is little possibility that p-type semiconductor layer absorbs water in the air or is combined with oxygen in the air to be oxidized.

In the semiconductor device according to the embodiment of the invention, a novel material not including Se (a laminate structure formed by alternately laminating the first semiconductor layer mainly including $Be_{x1}Mg_{x2}Zn_{x3}Te$ and the second semiconductor layer mainly including $Be_{x4}Mg_{x5}Zn_{x6}Te$) is applied to the p-type semiconductor layer, so it becomes possible to improve the reliability of the device, to increase the lifetime of the device, and to obtain superior light emitting characteristics.

Other and further objects, features and advantages of the invention will appear more fully from the following description.

DETAILED DESCRIPTION OF THE PREFERRED EMBODIMENTS

A preferred embodiment will be described in detail below referring to the accompanying drawings.

Figure 1:
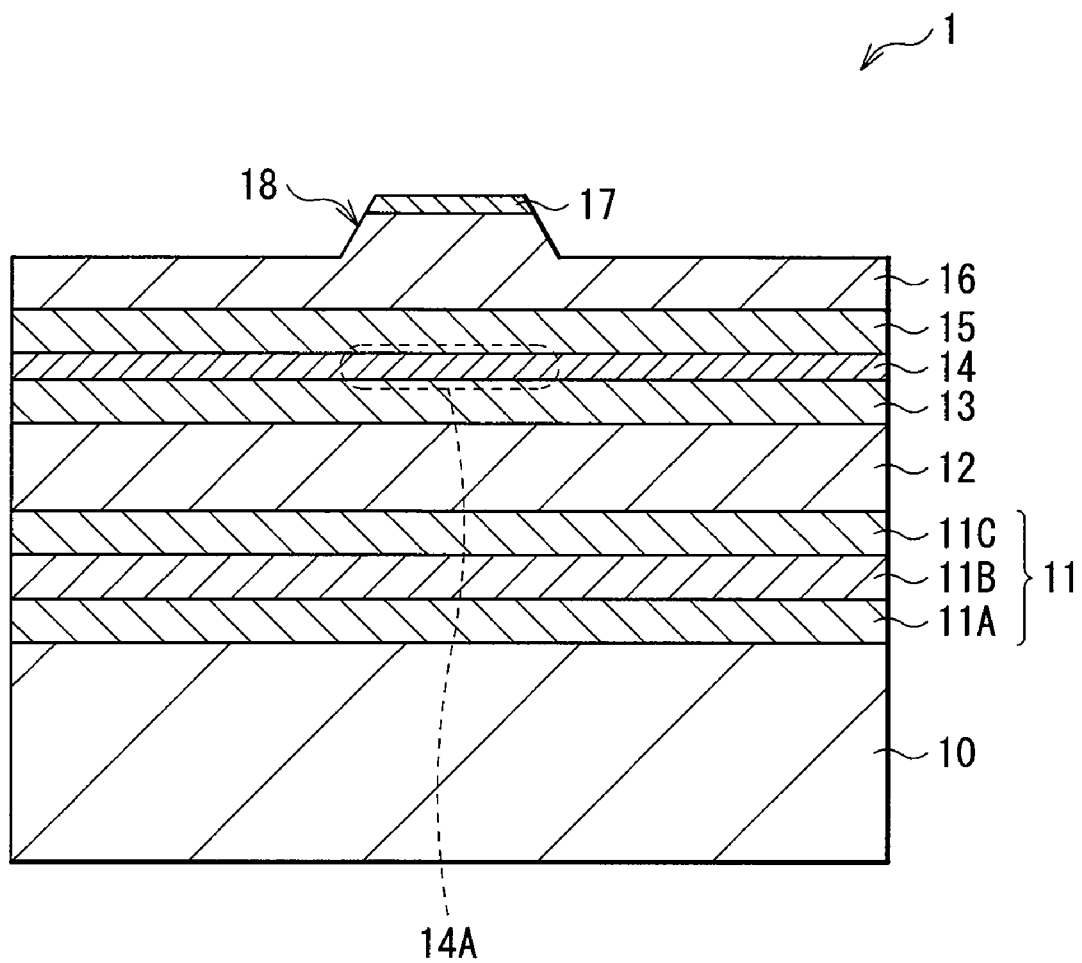
FIG. 1 is a sectional view of a laser diode device according to an embodiment of the invention.
Figure 2:
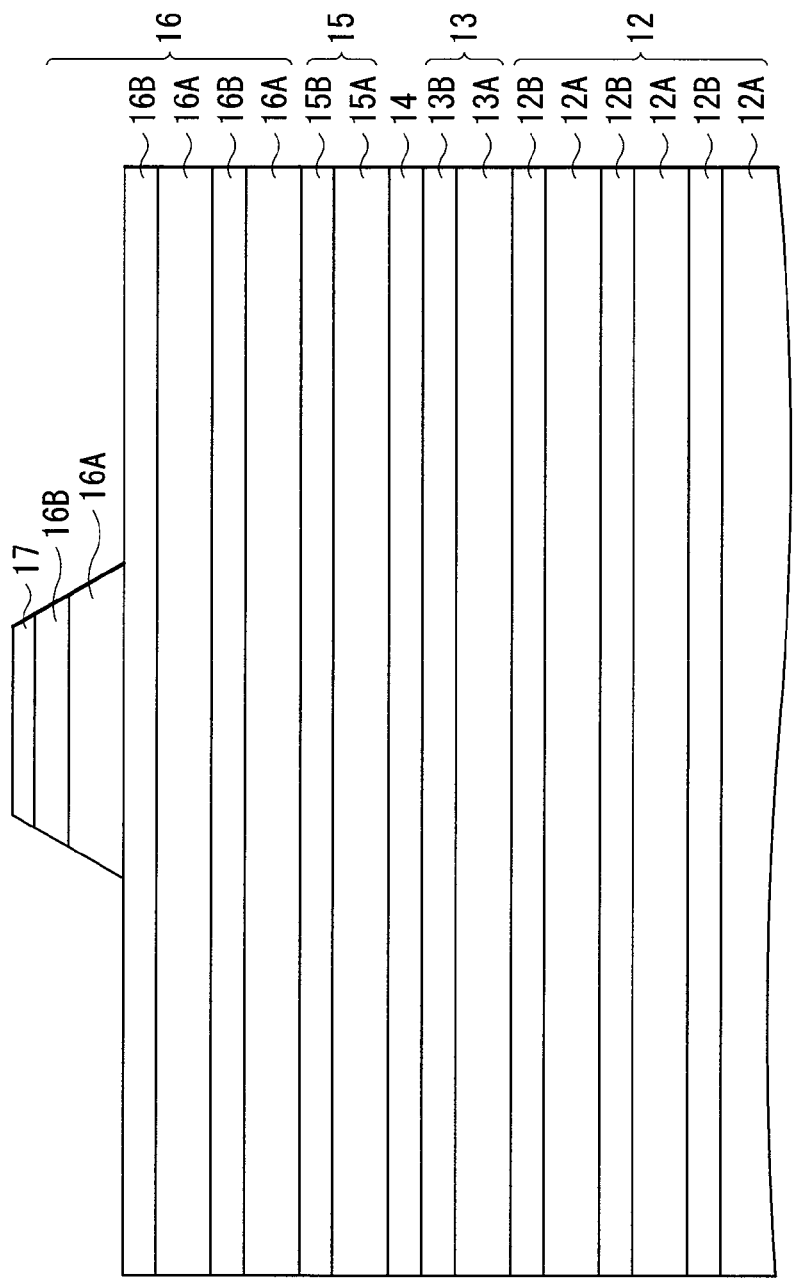
FIG. 2 is an enlarged sectional view of a part of the laser diode device shown in FIG. 1.
Figure 3:
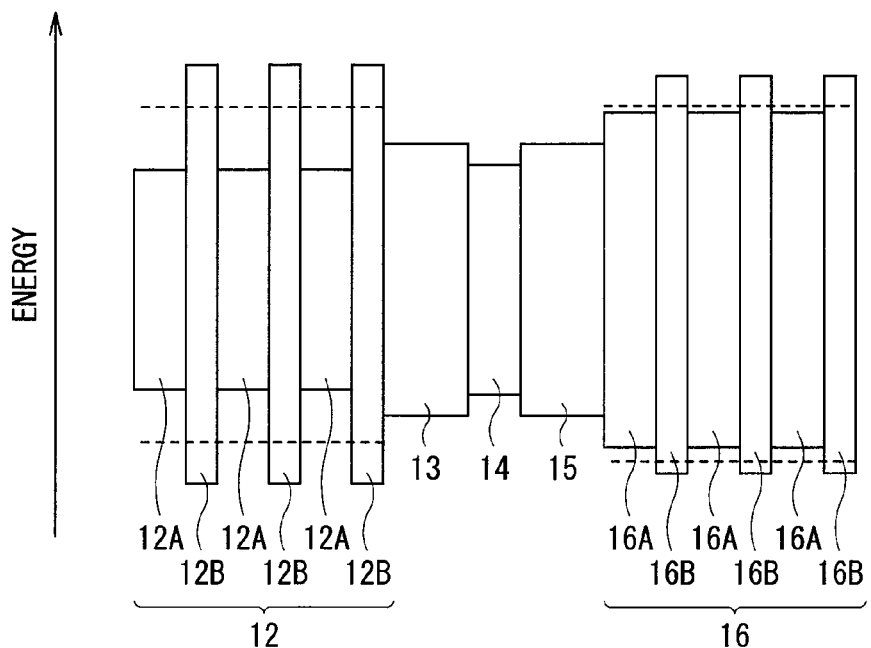
FIG. 3 is a conceptual diagram for describing the band structure of the laser diode device shown in FIG. 1.

FIG. 1 shows a sectional view of a laser diode device 1 according to an embodiment of the invention. FIG. 2 shows an enlarged sectional view of a part of the laser diode device 1 shown in FIG. 1. FIG. 3 schematically shows an example of the band structure of each layer shown in FIG. 2. The laser diode device 1 is formed by an epitaxial growth method, for example, a molecular beam epitaxy (MBE) method, or an metal organic chemical vapor deposition (MOCVD, MOVPE) method, and the laser diode device 1 is formed by depositing and growing a crystal film while maintaining a specific crystallographic orientation relationship with the crystal of a substrate 10.

The laser diode device 1 is formed by laminating a buffer layer 11, a lower cladding layer 12, a lower guide layer 13, an active layer 14, an upper guide layer 15, an upper cladding layer 16 and a contact layer 17 in this order on one surface of the substrate 10.

The substrate 10 is an InP substrate. The buffer layer 11 is formed on a surface of the substrate 10 to improve the crystal growth of each of semiconductor layers from the lower cladding layer 12 to the contact layer 17, and is formed by laminating, for example, buffer layers 11A, 11B and 11C in this order from the substrate 10. In this case, the buffer layer 11A is made of, for example, Si-doped n-type InP, the buffer layer 11B is made of, for example, Si-doped n-type InGaAs, and the buffer layer 11C is made of, for example, Cl-doped n-type ZnCdSe.

The lower cladding layer 12 mainly includes a Group II-VI compound semiconductor in which the energy gap is larger than the energy gaps of the lower guide layer 13 and the active layer 14, and the refractive index is smaller than the refractive indexes of the lower guide layer 13 and the active layer 14, and the bottom of the conduction band or the bottom of a sublevel in the conduction band is higher than the bottom of the conduction band of each of the lower guide layer 13 and the active layer 14 or the bottom of a sublevel in the conduction band of each of the layer guide layer 13 and the active layer 14. Thereby, it becomes possible to confine light and carriers within the lower guide layer 13 and the active layer 14.

The lower cladding layer 12 has a laminate structure formed by alternately laminating a first lower cladding layer 12A mainly including, for example, $Zn_{x7}Cd_{x8}Se$ ($0<x7<1$, $0<x8<1$, $x7+x8=1$) and a second lower cladding layer 12B mainly including MgSe, or a single-layer structure mainly including $Mg_{x9}Zn_{x10}Cd_{x11}Se$ ($0<x9<1$, $0<x10<1$, $0<x11<1$, $x9+x10+x11=1$).

In this case, as an n-type impurity included in the lower cladding layer 12, for example, Cl or the like is cited. Moreover, in FIGS. 2 and 3, the case where three first lower cladding layers 12A and three second lower cladding layers 12B are arranged is exemplified; however, four or more first lower cladding layers 12A and four or more second lower cladding layers 12B may be arranged, or two or less first lower cladding layers 12A and two or less second lower cladding layers 12B may be arranged.

Moreover, in the case where the first lower cladding layer 12A and the second lower cladding layer 12B form a superlattice structure, an effective energy gap is changeable (controllable) by the material (the composition ratio) of each layer and the ratio of the thickness of each layer (refer to broken lines in FIG. 3).

The lower guide layer 13 mainly includes a Group II-VI compound semiconductor in which the energy gap is larger than the energy gap of the active layer 14, and the refractive index is smaller than the refractive index of the active layer 14, and the bottom of the conduction band or the bottom of a sublevel in the conduction band is higher than the bottom of the conduction band of the active layer 14 or the bottom of a sublevel in the conduction band of the active layer 14.

The lower guide layer 13 has, for example, a laminate structure formed by alternately laminating a first lower guide layer 13A mainly including $Be_{x12}Zn_{x13}Se_{x14}Te_{x15}$ ($0<x12<1$, $0<x13<1$, $x12+x13=1$, $0<x14<1$, $0<x15<1$, $x14+x15=1$) and a second lower guide layer 13B mainly including MgSe.

However, in the case where the lower guide layer 13 has the above-described laminate structure, both of the first lower guide layer 13A and the second lower guide layer 13B are preferably undoped. In this description, "undoped" means that when a target semiconductor layer is manufactured, a dopant is not supplied to the semiconductor layer, and the concept of "undoped" includes the case where the target semiconductor layer does not include an impurity at all, or the case where the target semiconductor layer slightly includes an impurity diffused from another semiconductor layer or the like. Moreover, in FIG. 2, the case where one first lower guide layer 13A and one second lower guide layer 13B are arranged is exemplified; however, two or more first lower guide layers 13A and two or more second lower guide layers 13B may be arranged. In FIG. 3, the inside structure of the lower guide layer 13 is not shown.

The active layer 14 mainly includes a Group II-VI compound semiconductor with an energy gap corresponding to a desired emission wavelength, and has, for example, a quantum well structure (a laminate structure formed by alternately laminating a well layer and a barrier layer) mainly including $Be_{x16}Zn_{x17}Se_{x18}Te_{x19}$ ($0<x16<1$, $0<x17<1$, $x16+x17=1$, $0<x18<1$, $0<x19<1$, $x18+x19=1$), or a single-layer structure mainly including $Zn_{x20}Cd_{x21}Se$ ($0<x20<1$, $0<x21<1$, $x20+x21=1$). The whole active layer 14 is preferably undoped. In FIGS. 2 and 3, the inside structure of the active layer 14 is not shown.

The active layer 14 includes a light-emitting region 14A in a region facing a ridge section 18 which will be described later. The light-emitting region 14A has a stripe width equal to that of the bottom of the ridge section 18 facing the light-emitting region 14A, and corresponds to a current injection region into which a current confined by the ridge section 18 is injected.

The upper guide layer 15 mainly includes a Group II-VI compound semiconductor in which the energy gap is larger than the energy gap of the active layer 14, and the refractive index is smaller than the refractive index of the active layer 14, and the top of the valence band or the top of a sublevel in the valence band is lower than the top of the valence band of the active layer 14 or the top of a sublevel in the valence band of the active layer 14. Thereby, it becomes possible to confine light and carriers within the active layer 14.

The upper guide layer 15 has a laminate structure formed by alternately laminating a first upper guide layer 15A mainly including $Be_{x22}Zn_{x23}Se_{x24}Te_{x25}$ ($0<x22<1$, $0<x23<1$, $x22+x23=1$, $0<x24<1$, $0<x25<1$, $X24+x25=1$) and a second upper guide layer 15B mainly including MgSe.

However, in the case where the upper guide layer 15 has the above-described laminate structure, both of the first upper guide layer 15A and the second upper guide layer 15B are preferably undoped. Moreover, in FIG. 2, the case where one first upper guide layer 15A and one second upper guide layer 15B are arranged is exemplified; however, two or more first upper guide layers 15A and two or more second upper guide layers 15B may be arranged. In FIG. 3, the inside structure of the upper guide layer 15 is not shown.

The upper cladding layer 16 mainly includes a Group II-VI compound semiconductor in which the energy gap is larger than the energy gaps of the active layer 14 and the upper guide layer 15, and the refractive index is smaller than the refractive indexes of the active layer 14 and the upper guide layer 15, and the top of the valence band or the top of a sublevel in the valence band is lower than the top of the valence band of each of the active layer 14 and the upper guide layer 15 or the top of a sublevel in the valence band of each of the active layer 14 and the upper guide layer 15.

More specifically, the upper cladding layer 16 has a laminate structure formed by alternately laminating a first upper cladding layer 16A mainly including $Be_{x1}Mg_{x2}Zn_{x3}Te$ ($0<x1<1$, $0 \leq x2<1$, $0<x3<1$, $x1+x2+x3=1$) and a second upper cladding layer 16B mainly including $Be_{x4}Mg_{x5}Zn_{x6}Te$ ($0<x4<1$, $0<x5<1$, $0 \leq x6<1$, $x4+x5+x6=1$).

At least one of the first upper cladding layer 16A and the second upper cladding layer 16B is doped with at least one kind of p-type impurity. In this case, examples of the p-type impurity include N, P, O As, Sb, Li, Na, K and the like. Moreover, in FIGS. 2 and 3, the case where three first upper cladding layers 16A and three second upper cladding layers 16B are arranged is exemplified; however, four or more first upper cladding layers 16A and four or more second upper cladding layers 16B may be arranged, or two or less of first upper cladding layers 16 and two or less second upper cladding layers 16B may be arranged.

The contact layer 17 is formed by alternately laminating, for example, p-type BeZnTe and p-type ZnTe. In this case, in a top section of the upper cladding layer 16 and the contact layer 17, as described above, the striped ridge section 18 extending in an axial direction is formed. The ridge section 18 limits the current injection region of the active layer 14.

Moreover, in the laser diode device 1, a p-side electrode (not shown) is formed on a surface of the ridge section 18, and an n-side electrode (not shown) is formed on the back surface of the substrate 10. The p-side electrode is formed by laminating, for example, palladium (Pd), platinum (Pt) and gold (Au) in this order on the contact layer 17, and is electrically connected to the contact layer 17. Moreover, the n-side electrode has a structure formed by laminating, for example, an alloy of gold (Au) and germanium (Ge), nickel (Ni) and gold (Au) in this order, and is electrically connected to the substrate 10. The n-side electrode is fixed on a surface of a submount (not shown) for supporting the laser diode device 1, and is further fixed on a surface of a heat sink (not shown) through the submount.

The lower cladding layer 12, the lower guide layer 13, the active layer 14, the upper guide layer 15 and the upper cladding layer 16 are preferably lattice-matched to the substrate 10. In this case, the substrate 10 is an InP substrate, so other layers are preferably made of a material with a composition ratio which is lattice-matched to InP. Examples of Group II-VI compound semiconductors lattice-matched to InP include materials shown in the following Table 1. In view of a literature by T. Baron et al. (Journal of Crystal Growth 184/185, 415 (1998)), it is considered that BeZnTe and BeMgTe in Table 1 are capable of obtaining a hole concentration of $1 \times 10^{18}$ cm$^{-3}$ or over (for example, approximately $4 \times 10^{18}$ cm$^{-3}$) in either case where BeZnTe and BeMgTe each have a single-layer structure or a superlattice structure.

TABLE 1

| General expression | Material lattice-matched to InP | Energy gap (eV) |
| --- | --- | --- |
| ZnCdSe | $Zn_{0.48}Cd_{0.52}Se$ | 2.1 |
| ZnSeTe | $Zn_{0.5}Se_{0.5}Te$ | 2.58 |
| BeZnTe | $Be_{0.48}Zn_{0.52}Te$ | 2.77 |
| BeMgTe | $Be_{0.36}Mg_{0.64}Te$ | 3.7 |

Figure 4:
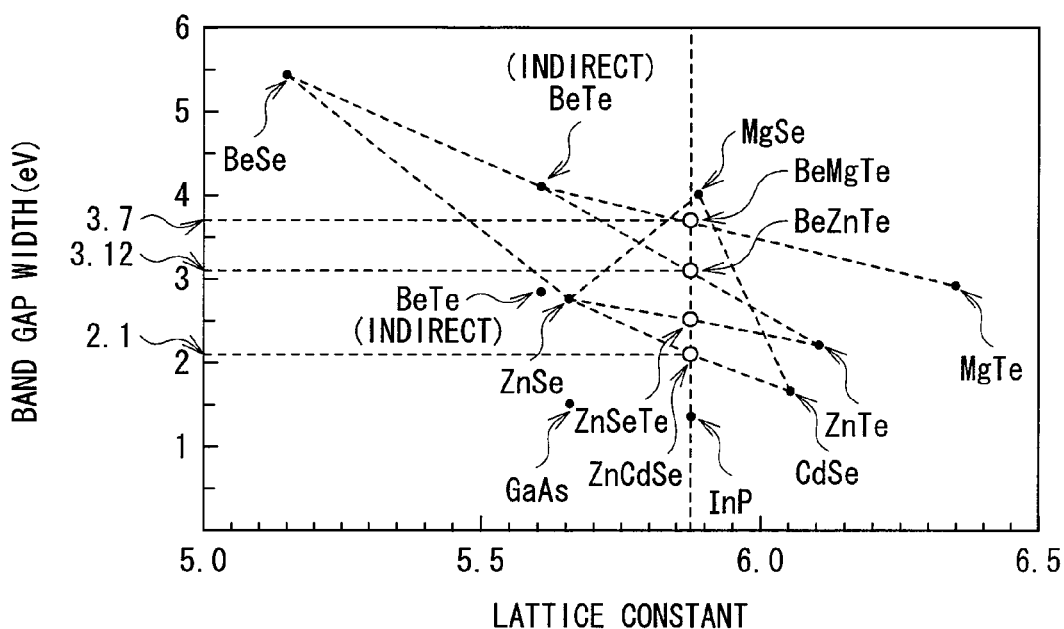
FIG. 4 is a relationship diagram showing a relationship between the lattice constant and the energy gap of a Group II-VI compound semiconductor.

In this case, the value of the energy gap of $Be_{0.36}Mg_{0.64}Te$ lattice-matched to InP may be estimated from FIG. 4 to be approximately 3.7 eV. The value is determined by interpolating between the values of the energy gaps of BeTe and MgTe which are binary mixed crystals, and a bowing effect observed in a ternary mixed crystal to some extent is not considered. Moreover, the bowing effect is not considered in the value of the energy gap of the following ternary mixed crystal. Further, the value of the direct transition energy gap at a Γ point of $Be_{0.48}Zn_{0.52}Te$ lattice-matched to InP may be estimated from FIG. 4 to be approximately 3.12 eV. Thereby, the value of the energy gap of a $Be_{0.48}Zn_{0.52}Te/Be_{0.36}Mg_{0.64}Te$ superlattice structure may be a value between 3.12 eV and 3.7 eV depending on the combination ratio of the thicknesses of superlattice layers. On the other hand, in the case where, for example, a quantum well structure (a laminate structure formed by alternately laminating a well layer and a barrier layer) mainly including $Be_{x16}Zn_{x17}Se_{x18}Te_{x19}$, or a single-layer structure mainly including $Zn_{x20}Cd_{x21}Se$ is used as the active layer 14, the value of the energy gap of the active layer 14 may be a value (2.06 to 2.58 eV) of an energy gap corresponding to a wavelength ranging from orange (600 nm) to blue-green (480 nm). Therefore, in the case where a $Be_{0.48}Zn_{0.52}Te/Be_{0.36}Mg_{0.64}Te$ superlattice structure is used as the upper cladding layer 16, while the upper cladding layer 16 is lattice-matched to InP, the value of the energy gap of the upper cladding layer 16 is allowed to be larger than that of the active layer 14.

Next, band engineering of the $Be_{0.48}Zn_{0.52}Te/Be_{0.36}Mg_{0.64}Te$ superlattice structure lattice-matched to InP will be described below. According to W. Faschinger et al. (refer to Journal of Crystal Growth 197, 557 (1999)) and D. Segev et al. (refer to PHYSICAL REVIEW B68, 165336

(2003)), the top of the valence band of $Be_{0.36}Mg_{0.64}Te$ is on an energy side approximately 0.31 eV lower than that of the valence band of $Be_{0.48}Zn_{0.52}Te$. Therefore, in the $Be_{0.48}Zn_{0.52}Te/Be_{0.36}Mg_{0.64}Te$ superlattice structure, a subband in the valence band is shifted to a low energy side, so in the case where the $Be_{0.48}Zn_{0.52}Te/Be_{0.36}Mg_{0.64}Te$ superlattice structure is used as the upper cladding layer 16, a potential barrier to the active layer 14 may be reduced. In other words, $Be_{0.36}Mg_{0.64}Te$ fulfills the role which MgSe fulfills in a MgSe/BeZnTe superlattice structure used in the past.

Moreover, MgSe and MgTe have equivalent hygroscopicity in the air; however, it is said that in CdMgTe, when the Mg composition ratio is 75% or less, CdMgTe has a zinc blend (ZB) structure, and oxidation reaction does not occur (refer to J. M. Hartmann et al., J. Appl. Phys. 80, 6257 (1996)). On the other hand, BeMgTe is lattice-matched to InP when the Mg composition ratio is approximately 64%, and the Mg composition ratio at this time is sufficiently smaller than 75%. Therefore, it is considered that $Be_{0.36}Mg_{0.64}Te$ lattice-matched to InP is more resistant to oxidation and moisture absorption than MgSe.

Further, it is known from experience that Be and Se have high reactivity, and in a BeZnTe/MgSe superlattice structure in a related art, BeSe may be formed in an interface. On the other hand, in the BeZnTe/BeMgTe superlattice structure, only Te belongs to Group VI, so there is little possibility that BeSe is formed.

In a state in which Se and Te exit at the same time, a phenomenon that Se is preferentially combined to a Group II element, and it is difficult for Te to enter, or a phenomenon that Se and Te are deposited is concerned. However, in the BeZnTe/BeMgTe superlattice structure, only Te which easily introduces N as a p-type dopant belongs to Group VI, so there is little possibility that the competition reaction between Se and Te or separate deposition of Se and Te occurs.

In a Be chalcogenide system, compared to other Group VI elements except for oxygen (such as Se and Te), the ionic radius of Be ions is extremely small, so as a result, Be ions have a high degree of covalent binding. It is said that the strength of the crystal itself is high, so the occurrence or propagation of defects such as dislocation is prevented. It is expected that compared to a structure using a BeZnTe/MgSe superlattice structure in the related art, when the BeZnTe/BeMgTe superlattice structure is formed, effects such as an improvement in the reliability of the device are achieved. It is said that in the structure using the BeZnTe/MgSe superlattice structure in the related art, a large number of crystal defects occur; however, in the BeZnTe/BeMgTe superlattice structure, Be exists in both layers of the superlattice structure, so it is expected that the propagation of crystal defects is reduced.

The laser diode device 1 with such a structure is manufactured by the following steps, for example.

Each of the above-described semiconductor layers is formed by crystal growth using a two growth chamber molecular beam epitaxy (MBE) system. At first, after suitable surface processing is performed on the substrate 10 made of InP, the substrate 10 is placed in the MBE system. Next, the substrate 10 goes to a preparatory chamber for sample change, and then the pressure in the preparatory chamber is reduced to $10^{-3}$ Pa or less by a vacuum pump, and the substrate 10 is heated to 100° C. to remove remaining water and an impurity gas from the substrate 10.

Next, the substrate 10 is transferred to a growth chamber dedicated to Group III-V compound semiconductor growth, and while applying a P molecular beam to a surface of the substrate 10, the substrate 10 is heated until the temperature of the substrate reaches 500° C. Thereby, an oxide film on the surface of the substrate 10 is removed. After that, after the substrate 10 is heated until the temperature of the substrate 10 reaches 450° C., and Si-doped n-type InP is grown to have a thickness of 30 nm, thereby the buffer layer 11A is formed, the substrate 10 is heated until the temperature of the substrate 10 reaches 470° C., and Si-doped n-type InGaAs is grown to have a thickness of 200 nm, thereby the buffer layer 11 is formed.

Then, the substrate 10 is transferred to a growth chamber dedicated to Group II-VI compound semiconductor growth, and while applying a Zn molecular beam to a surface of the buffer layer 11B, the substrate 10 is heated until the temperature of the substrate 10 reaches 200° C., and Cl-doped n-type ZnCdSe is grown to have a thickness of 5 nm, and then the substrate 10 is heated until the temperature of the substrate 10 reaches 280° C., and Cl-doped n-type ZnCdSe is grown to have a thickness of 100 nm, thereby the buffer layer 11C is formed. Next, in a state in which the temperature of the substrate 10 is kept at 280° C., a Cl-doped n-type ZnCdSe/MgSe superlattice structure is grown to have a thickness of 0.5 μm, thereby the lower cladding layer 12 is formed, and a BeZnSeTe/MgSe superlattice structure is grown to have a thickness of 70 nm, thereby the lower guide layer 13 is formed, and a BeZnSeTe quantum well structure is grown to have a thickness of 10 nm, thereby the active layer 14 is formed, and a BeZnSeTe/MgSe superlattice structure is grown to have a thickness of 70 nm, thereby the upper guide layer 15 is formed, and an N-doped p-type BeZnTe/BeMgTe superlattice structure is grown to have a thickness of 0.6 μm, thereby the upper cladding layer 16 is formed, and N-doped p-type BeZnTe is grown to have a thickness of 30 nm, and an N-doped p-type BeZnTe/ZnTe laminate structure is grown to have a thickness of 500 nm, and then N-doped p-type ZnTe is grown to have a thickness of 30 nm, thereby the contact layer 17 is formed.

Next, after a resist pattern (not shown) with a predetermined shape is formed on the contact layer 17 by lithography to coat a region except for a striped region where the ridge section 18 is formed with the resist pattern, for example, a Pd/Pt/Au multilayer film (not shown) is laminated on the whole surface by vacuum deposition. After that, the resist pattern is removed with the Pd/Pt/Au laminate film deposited on the resist pattern by lift-off. Thereby, the p-side electrode (not shown) is formed on the contact layer 17. After that, heat treatment is performed if necessary to establish ohmic contact between the p-side electrode and the contact layer 17. Next, on the whole back surface of the substrate 10, for example, an AuGe alloy or a Ni/Au multilayer film (not shown) is laminated by vacuum deposition to form the n-side electrode (not shown).

Next, an end of a wafer is scratched by a diamond cutter, and is cleaved by applying a pressure to break the wafer along scratches. Next, by evaporation or sputtering, a low reflecting coating (not shown) with reflectivity of approximately 5% is formed on an end surface (a front end surface) on a light emission side, and a high reflecting coating (not shown) with a reflectivity of approximately 95% is formed on an end surface (a rear end surface) opposite to the front end surface. Next, the wafer is scribed along a stripe direction of the ridge section 18 into chips.

Next, after a chip is arranged on a submount (not shown) while the position of a light emission point and the angle of an end are adjusted, the chip is arranged on a heat sink (not shown). Next, after the p-side electrode on the chip and a terminal on a stem (not shown) are connected to each other by a gold wire, a window cap from which laser light is emitted is put on the stem to hermetically seal the stem. Thus, the laser diode device 1 according to the embodiment is manufactured.

Next, functions and effects of the laser diode device 1 according to the embodiment will be described below.

In the laser diode device 1 according to the embodiment, when a predetermined voltage is applied between the p-side electrode and the n-side electrode, a current is injected into the active layer 14, and light is emitted by electron-hole recombination, and, for example, laser light with a wavelength ranging from blue-violet to orange (480 nm to 600 nm) is emitted from a part (a light emission spot) corresponding to the light-emitting region 14A of the front end surface toward a laminate in-plane direction.

In this case, in the embodiment, the upper cladding layer 16 has a laminate structure formed by alternately laminating the first upper cladding layer 16A mainly including $Be_{x1}Mg_{x2}Zn_{x3}Te$ and the second upper cladding layer 16B mainly including $Be_{x4}Mg_{x5}Zn_{x6}Te$, so hygroscopicity is high, and an easily oxidizable material does not exit. Thereby, there is little possibility that the upper cladding layer 16 absorbs water in the air or is combined with oxygen in the air to be oxidized.

Moreover, Se is not included in the Group VI elements of the upper cladding layer 16, so there is little possibility that in the upper cladding layer 16, Be and Se which have specifically high reactivity react to form BeSe. Moreover, there is little possibility that a phenomenon that Se and Te are combined, thereby it is difficult for Te to enter or a phenomenon that Se and Te are deposited occurs.

Further, even if the energy gap of the upper cladding layer 16 is increased, while a sufficient p-type hole concentration is obtained, it becomes possible to keep the activation ratio at 1% or over. Thereby, there is little possibility that crystal defects caused by N in the upper cladding layer 16 occur, and the amount of $Mg_3N_2$ produced by combining doped N to Mg in the upper cladding layer 16 may be reduced.

In the Be chalcogenide system, the ionic radius of Be ions is extremely small, compared to those of other Group VI elements (such as Se and Te) except for oxygen, so Be ions have a high degree of covalent binding. Moreover, the strength of the crystal itself is high. Therefore, it becomes possible to prevent the occurrence or propagation of defects such as dislocation. Therefore, Be exists in both of the first upper cladding layer 16A and the second upper cladding layer 16B, so it becomes possible to prevent the occurrence or propagation of defects such as dislocation.

Thus, in the embodiment, a novel material not including Se (a laminate structure formed by alternately laminating a first semiconductor layer mainly including $Be_{x1}Mg_{x2}Zn_{x3}Te$ and a second semiconductor layer mainly including $Be_{x4}Mg_{x5}Zn_{x6}Te$) is applied to the upper cladding layer 16, so it becomes possible to improve the reliability of the device, to increase the lifetime of the device, and to obtain superior light emitting characteristics.

Although the present invention is described referring to the embodiment, the invention is not limited to the above-described embodiment, and may be variously modified.

For example, in the above-described embodiment, a laminate formed by alternately laminating the first upper cladding layer 16A mainly including $Be_{x1}Mg_{x2}Zn_{x3}Te$ and the second upper cladding layer 16B mainly including $Be_{x4}Mg_{x5}Zn_{x6}Te$ is applied to the upper cladding layer 16; however, any other Group II-VI compound semiconductor may be applied to the upper cladding layer 16.

For example, a semiconductor including Cd as a Group II element, more specifically a laminate structure (or a superlattice structure) formed by alternately laminating $Cd_{x26}Be_{x27}Mg_{x28}Zn_{x29}Te$ ($0<x26<1$, $0\leq x27<1$, $0<x28<1$, $0\leq x29<1$, $x26+x27+x28+x29=1$) and $Cd_{x30}Be_{x31}Mg_{x32}Zn_{x33}Te$ ($0<x30<1$, $0\leq x31<1$, $0\leq x32<1$, $0<x33<1$, $x30+x31+x32+x33=1$) may be applied to the upper cladding layer 16.

Moreover, for example, a semiconductor mainly including Te as a Group VI element and including a slight amount of Se, S or the like, more specifically a laminate structure (or a superlattice structure) formed by alternately laminating $Be_{x34}Mg_{x35}Zn_{x36}Te_{x37}Se_{x38}S_{x39}$ ($0<x34<1$, $0<x35<1$, $0\leq x36<1$, $x34+x35+x36=1$, $x37+x38+x39=1$, $x37>x38+x39$) and $Be_{x40}Mg_{x41}Zn_{x42}Te_{x43}Se_{x44}S_{x45}$ ($0<x40<1$, $0\leq x41<1$, $0<x42<1$, $x40+x41+x42=1$, $x43+x44+x45=1$, $x43>x44+x45$) may be applied to the upper cladding layer 16.

Further, in the above-described embodiment, the case where the invention is applied to the laser diode device is described; however, the invention is applicable to a semiconductor device such as a light emitting diode (LED) or a photo detector (PD).

Figure 5:
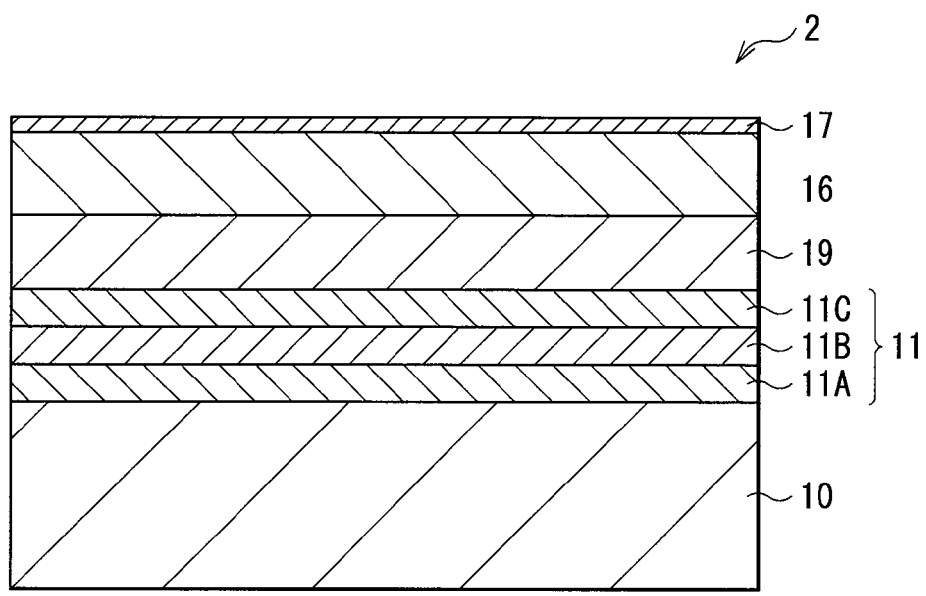
FIG. 5 is a sectional view of a light emitting diode or a photo detector according to another embodiment of the invention.
Figure 6:
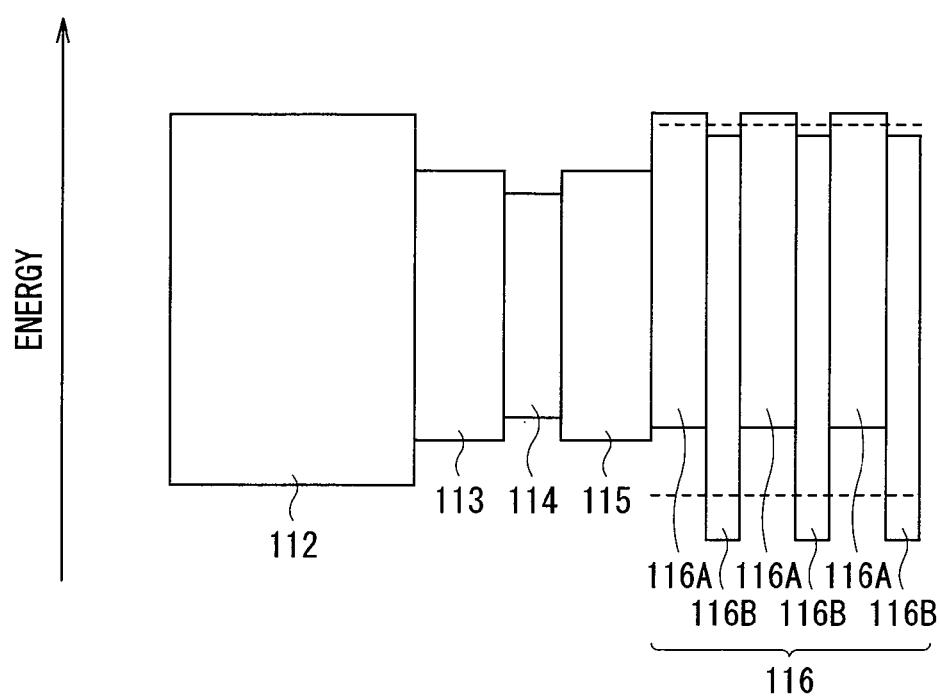
FIG. 6 is a conceptual diagram for describing the band structure of a laser diode device in a related art.

For example, as shown in FIG. 5, a semiconductor device 2 such as a light emitting diode or a photo detector may be formed by laminating the buffer layer 11, a base layer 19, the upper cladding layer 16 and the contact layer 17 in this order on the substrate 10. In this case, the base layer 19 is preferably made of, for example, Cl-doped n-type ZnCdSe, and is preferably lattice-matched to the substrate 10.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   an InP substrate;
   a cladding layer carried on the substrate; and
   an active region layer between the cladding layer and the substrate;
   wherein,
   the cladding layer is a p-type semiconductor layer,
   the p-type semiconductor layer has a laminate structure of alternate layers of a first semiconductor layer mainly including $Be_{x1}Mg_{x2}Zn_{x3}Te$ ($0<x1<1$, $0\leq x2<1$, $0<x3<1$, $x1+x2+x3=1$) and a second semiconductor layer mainly including $Be_{x4}Mg_{x5}Zn_{x6}Te$ ($0<x4<1$, $0<x5<1$, $0\leq x6<1$, $x4+x5+x6=1$), and
   the second semiconductor layer is lattice-matched to the InP substrate.

2. The semiconductor device according to claim 1, wherein the p-type semiconductor layer has a superlattice structure.

3. The semiconductor device according to claim 1, wherein the p-type semiconductor layer includes at least one selected from the group consisting of N, P, O, As, Sb, Li, Na and K as a dopant.

4. The semiconductor device according to claim 1, wherein both the first semiconductor layer and the second semiconductor layer are lattice-matched to the InP substrate.

5. The semiconductor device according to claim 4, wherein
   the first semiconductor layer mainly includes $Be_{0.48}Zn_{0.52}Te$, and
   the second semiconductor layer mainly includes $Be_{0.36}Mg_{0.64}Te$.

6. The semiconductor device according to claim 1, wherein the carrier activation ratios of the first semiconductor layer and the second semiconductor layer are 1% or over.

7. The semiconductor device according to claim 1, further comprising an n-type semiconductor layer and an undoped semiconductor layer, in this order from the InP substrate, between the InP substrate and the p-type semiconductor layer.

8. The semiconductor device according to claim 7, wherein the n-type semiconductor layer and the undoped semiconductor layer each are lattice-matched to the InP substrate.

9. The semiconductor device according to claim 7, wherein the energy gap of the p-type semiconductor layer is larger than the energy gap of the undoped semiconductor layer.

10. The semiconductor device according to claim 9, wherein the energy gap of the p-type semiconductor layer is larger than 2.1 eV.

11. The semiconductor device according to claim 7, wherein the undoped semiconductor layer mainly includes ZnCdSe.

12. The semiconductor device according to claim 9, wherein the energy gap of the p-type semiconductor layer is larger than 3.12 eV.

13. The semiconductor device according to claim 12, wherein the undoped semiconductor layer mainly includes BeZnSeTe.

14. The semiconductor device according to claim 7, wherein the top of a sublevel in the valence band of the p-type semiconductor layer is lower than the top of the valence band of the undoped semiconductor layer or the top of a sublevel in the valence band of the undoped semiconductor layer.

15. The semiconductor device according to claim 7, wherein the n-type semiconductor layer is made of a Group II-VI compound semiconductor including Se.

16. The semiconductor device according to claim 7, wherein another cladding layer comprises the n-type semiconductor layer.

17. The semiconductor device according to claim 1, further comprising:
    a guide layer between the active layer and the cladding layer, the guide layer having a larger energy gap than the active layer and a smaller energy gap than the cladding layer.

* * * * *